(12) United States Patent
Ausschnitt et al.

(10) Patent No.: US 8,638,438 B2
(45) Date of Patent: Jan. 28, 2014

(54) SELF-CALIBRATED ALIGNMENT AND OVERLAY TARGET AND MEASUREMENT

(75) Inventors: Christopher P. Ausschnitt, Naples, FL (US); Nelson Felix, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 13/211,594

(22) Filed: Aug. 17, 2011

(65) Prior Publication Data

US 2013/0044320 A1  Feb. 21, 2013

(51) Int. Cl.
*G01B 11/00* (2006.01)
(52) U.S. Cl.
USPC .............. 356/401; 356/399; 356/400; 700/98
(58) Field of Classification Search
USPC .................................... 356/399–401; 700/98
See application file for complete search history.

(56) References Cited

U.S. PATENT DOCUMENTS

| | | | |
|---|---|---|---|
| 5,877,861 A | 3/1999 | Ausschnitt et al. | |
| 6,141,082 A * | 10/2000 | Nara et al. | 355/53 |
| 6,638,671 B2 | 10/2003 | Ausschnitt et al. | |
| 7,474,401 B2 | 1/2009 | Ausschnitt et al. | |
| 8,361,683 B2 * | 1/2013 | Ausschnitt et al. | 430/22 |
| 2007/0058169 A1 | 3/2007 | Ausschnitt et al. | |

OTHER PUBLICATIONS

Ausschnitt et al., pending U.S. Appl. No. 12/757,344 entitled "Multi-Layer Chip Overlay Target and Measurement," filed with the U.S. Patent and Trademark office on Apr. 9, 2010.

* cited by examiner

*Primary Examiner* — Tarifur Chowdhury
*Assistant Examiner* — Isiaka Akanbi
(74) *Attorney, Agent, or Firm* — Cantor Colburn LLP; Yuanmin Cai

(57) ABSTRACT

An alignment feature disposed on a substrate, the alignment feature including a first lithographic pattern having a first aggregate geometric center point defined by a first sub-pattern comprising alignment marks having a first sub-pattern geometric center point arranged a distance ($d_0$) in a first direction from the first aggregate geometric center point, and a second sub-pattern comprising alignment marks having a second sub-pattern geometric center point arranged the distance $d_0$ in a reciprocal direction of the first direction from the first aggregate geometric center point.

16 Claims, 10 Drawing Sheets

US 8,638,438 B2

SELF-CALIBRATED ALIGNMENT AND OVERLAY TARGET AND MEASUREMENT

BACKGROUND

The present invention relates to lithographic patterning, and more specifically, to calibrating and aligning layers of lithographic patterns.

Lithographic patterning methods often include patterning a series of layers of lithographic patterns on a substrate. The layers of lithographic patterns are often aligned using alignment marks that are defined in the layers. For example a first lithographic layer having a first set of alignment marks may be patterned on a substrate. A subsequent lithographic layer having a second set of alignment marks is aligned to the first patterned lithographic layer using the first set of alignment marks. Aligning to the first set of marks includes measuring the error in the position of the marks relative to their intended locations (the locations specified in the design) using an alignment metrology tool, which is typically a sub-system of the lithography exposure tool. After aligning to the first set of marks, the second lithographic layer containing the second set of marks is patterned on the substrate. The location of the second set of alignment marks relative to the first, known as "overlay", may be measured using overlay metrology tools. Overlay errors may be caused by the lithographic equipment or process. The accuracy of the alignment and overlay measurements may be limited by the precision, calibration, and matching capabilities of the metrology tools.

BRIEF SUMMARY

According to one embodiment of the present invention, an alignment feature disposed on a substrate, the alignment feature including a first lithographic pattern having a first aggregate geometric center point defined by a first sub-pattern comprising alignment marks having a first sub-pattern geometric center point arranged a distance ($d_0$) in a first direction from the first aggregate geometric center point, and a second sub-pattern comprising alignment marks having a second sub-pattern geometric center point arranged the distance $d_0$ in a reciprocal direction of the first direction from the first aggregate geometric center point.

According to one embodiment of the present invention, a method for measuring alignment marks on a substrate includes patterning a first lithographic pattern having a first aggregate geometric center point ($A_0$) defined by a first sub-pattern comprising alignment marks having a first sub-pattern geometric center point ($A^+$) arranged a distance ($d_0$) in a first direction from the first aggregate geometric center point, and a second sub-pattern comprising alignment marks having a second sub-pattern geometric center point ($A^-$) arranged the distance $d_0$ in a reciprocal direction of the first direction from the first aggregate geometric center point, and measuring a position error ($\Delta A^+$) of the first sub-pattern relative a position of the first sub-pattern geometric center and a position error ($\Delta A^-$) of the second sub-pattern relative to an intended position of the second sub-pattern geometric center, and calculating a measured alignment offset ($d_m$) of the sub-pattern geometric centers from the first aggregate geometric center, wherein $d_m = (\Delta A^+ - \Delta A^-)/2$.

According to yet another embodiment of the present invention, a method for measuring alignment marks on a substrate includes patterning a first lithographic pattern on the substrate, the first lithographic pattern comprising alignment marks having a first aggregate geometric center point ($A_0$), patterning a second lithographic pattern on the substrate, the second lithographic pattern having a second aggregate geometric center point ($B_0$) defined by a first sub-pattern comprising alignment marks having a first sub-pattern geometric center point ($B^+$) arranged a distance ($d_0$) in a first direction from the second aggregate geometric center point, and a second sub-pattern comprising alignment marks having a second sub-pattern geometric center point ($B^-$) arranged the distance $d_0$ in a second direction from the second aggregate geometric center point, and measuring a position ($\Delta B^+ A_0$) of the first sub-pattern relative to the point $A_0$, measuring a position ($\Delta B^- A_0$) of the second sub-pattern relative to the point $A_0$.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
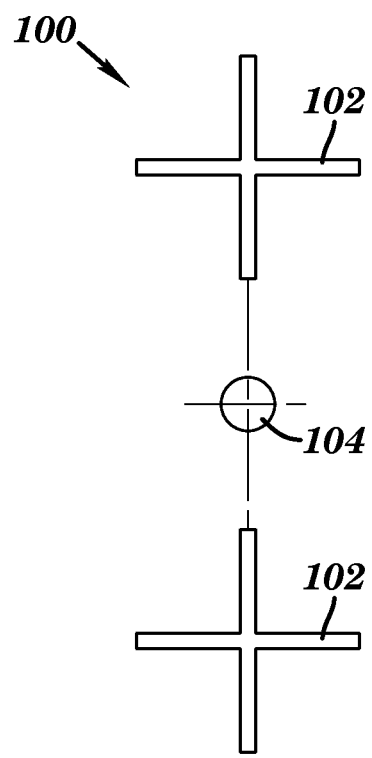
FIG. 1 illustrates a prior art example of alignment marks of a first lithographic pattern arranged on a substrate.
Figure 2:
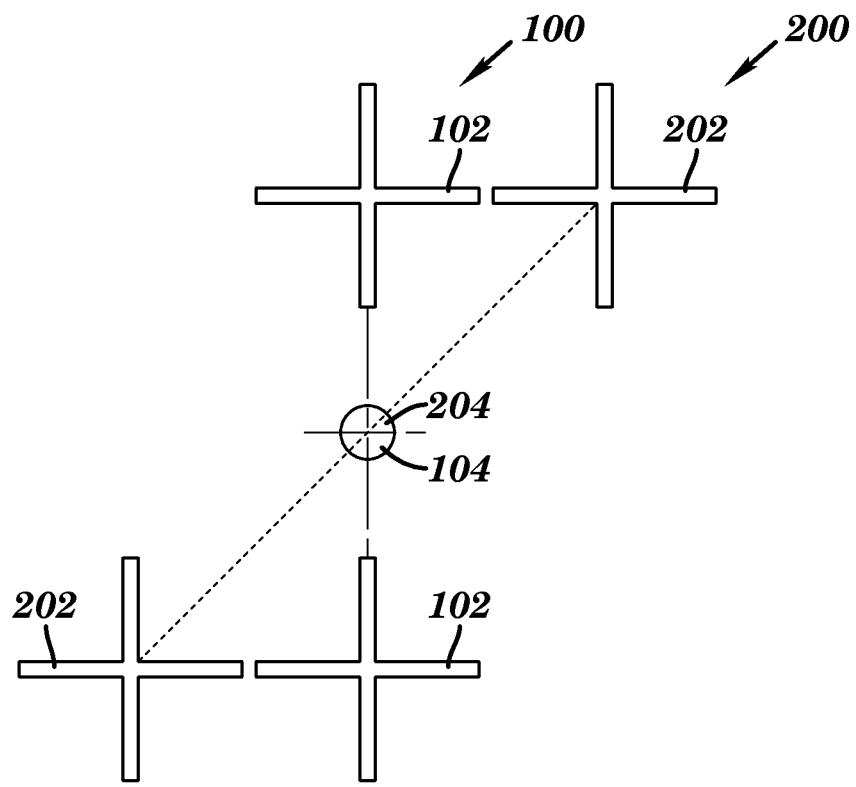
FIG. 2 illustrates a prior art example of alignment marks of a second lithographic pattern arranged on the substrate of FIG. 1.
Figure 3:
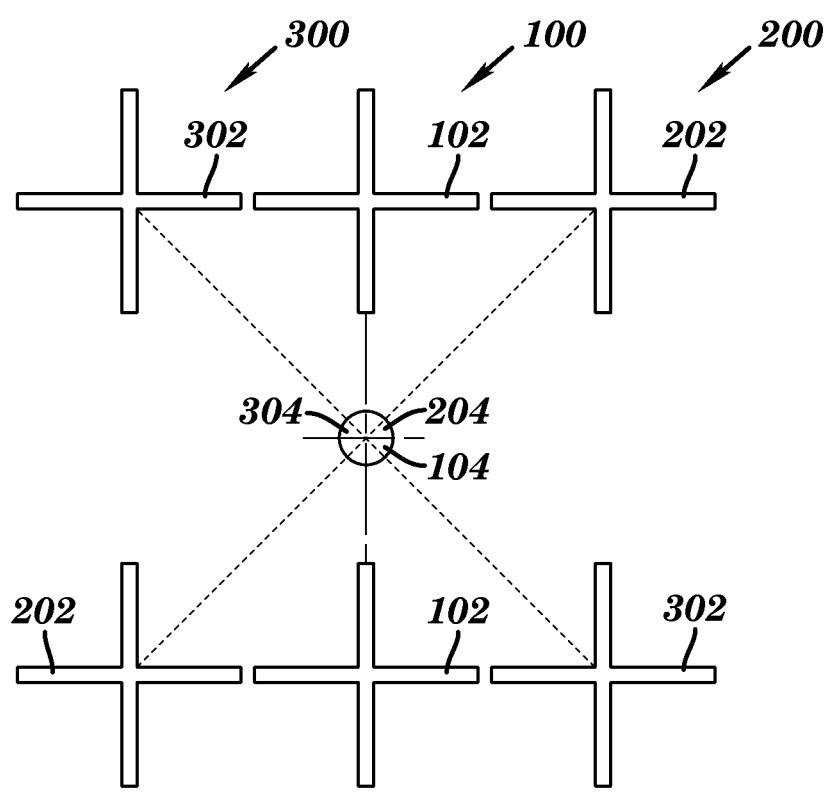
FIG. 3 illustrates a prior art example of alignment marks of a third lithographic pattern arranged on the substrate of FIG. 1.

FIGS. 1-3 illustrate a prior art method and arrangement of alignment marks. Referring to FIG. 1, alignment marks 102 of a first lithographic pattern 100 are arranged on a substrate having a point 104 disposed at a geometric center of the first lithographic pattern 100. FIG. 2 illustrates the additional alignment marks 202 of a second lithographic pattern 200 arranged on the substrate following the patterning of the first lithographic pattern 100. The point 204 is disposed at the geometric center of the second lithographic pattern 200 and is properly aligned with the point 104. FIG. 3 illustrates the alignment marks 302 of a third lithographic pattern 300 that is arranged on the substrate following the patterning of the second lithographic pattern 200. The geometric center of the third lithographic pattern 300 is illustrated by the point 304 that is properly aligned with the points 104 and 204.

Though the lithographic patterns of FIG. 3 are properly aligned, in practice, errors such as reticle errors or other factors such as planar irregularities in the substrate may introduce an undesirable misalignment between the alignment marks 102, 202, and 302. Previous methods allow the determination of whether the alignment marks are misaligned; however, the previous methods of measuring the misalignments could be erroneous due to errors in the metrology tools used to make the measurements.

Figure 4:
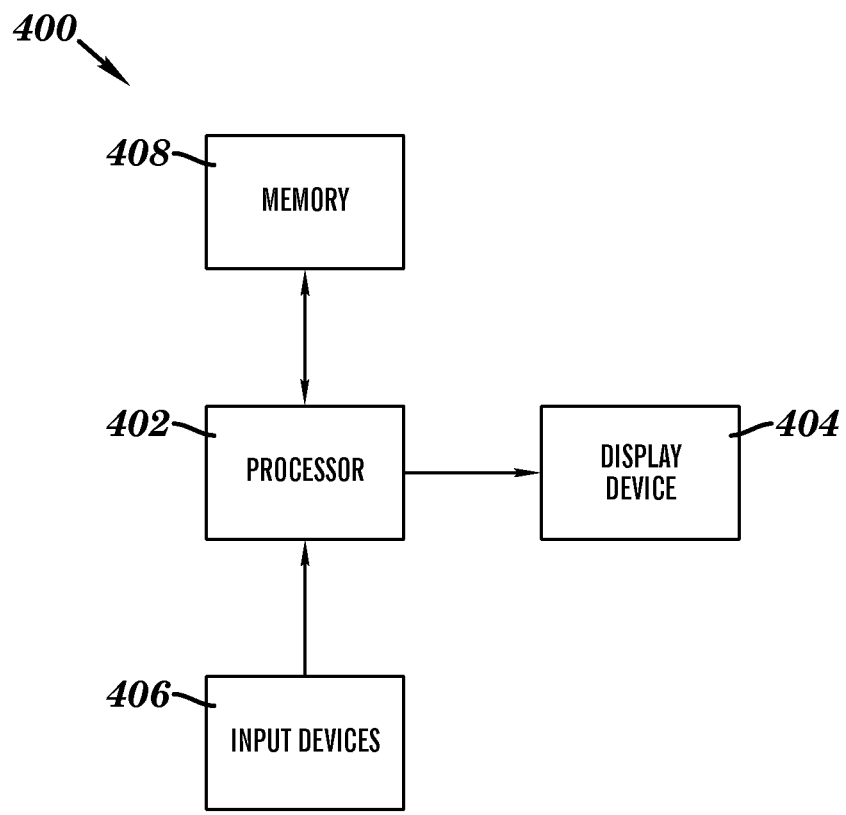
FIG. 4 illustrates an exemplary embodiment of a system.

FIG. 4 illustrates an exemplary embodiment of a system 400 that may be used to perform the methods described below. In this regard, the system 400 includes a processor 402 that is communicatively connected to a display device 404, input devices 406, and a memory 408.

Figure 5:
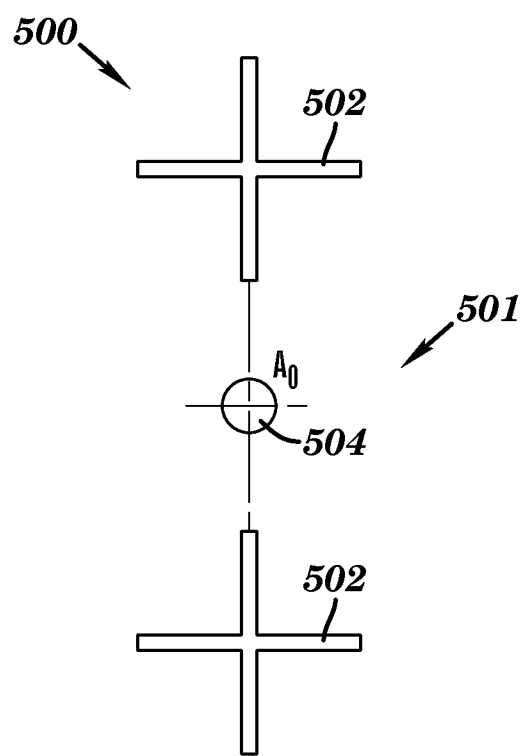
FIG. 5 illustrates an exemplary arrangement of alignment marks of a first lithographic pattern arranged on a substrate.
Figure 6:
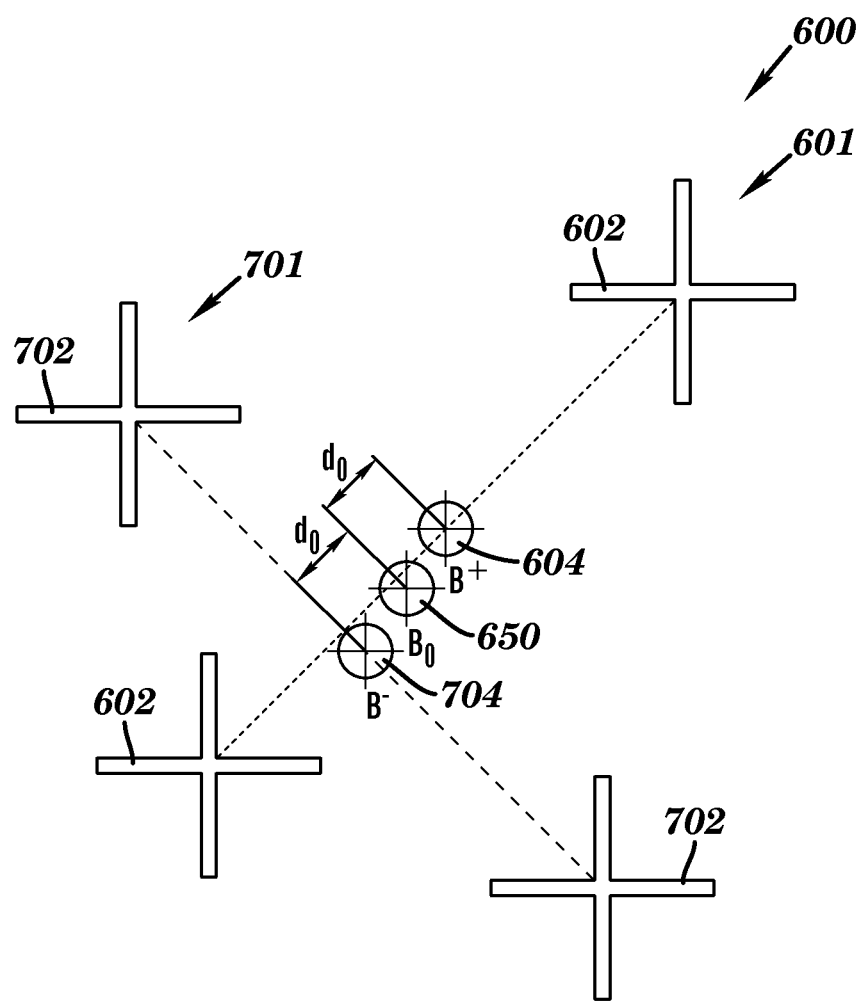
FIG. 6 illustrates an exemplary arrangement of alignment marks of a second lithographic pattern.
Figure 7:
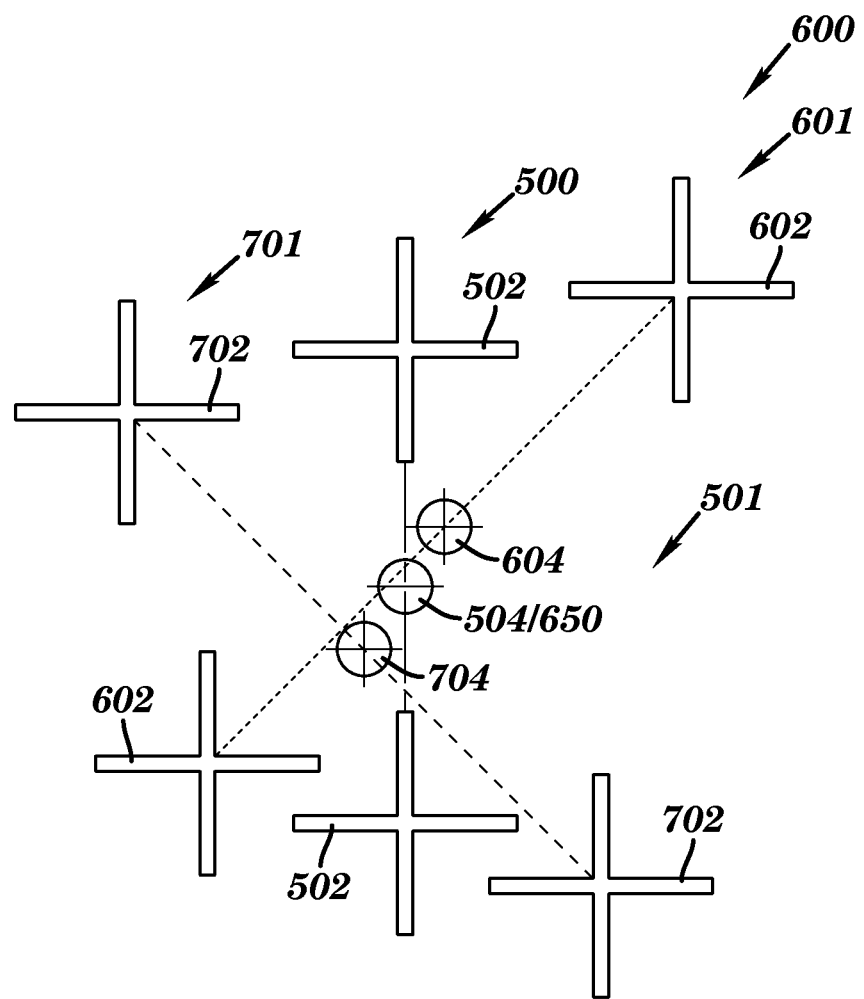
FIG. 7 illustrates an exemplary arrangement of alignment marks of the first lithographic pattern of FIG. 5 and the second lithographic pattern of FIG. 6 on the substrate.

FIGS. 5-7 illustrate an exemplary method for arranging alignment marks. Referring to FIG. 5, a first lithographic pattern 500 is patterned on a substrate 501. The first lithographic pattern 500 includes alignment marks 502 that define a geometric center point 504. In the illustrated embodiment, the alignment marks 502 are formed in a cross shape. However, any other shape may be used for the alignment marks 502 and any other exemplary alignment marks that are described below.

FIG. 6 illustrates a second lithographic pattern 600. The second lithographic pattern includes two sub-patterns. A first sub-pattern 601 is defined by alignment marks 602 having a geometric center point 604. A second sub-pattern 701 is defined by alignment marks 702 having a geometric center point 704. The first and second sub-patterns 601 and 701 are offset an equal distance or magnitude (B) in reciprocal directions from a geometric center point 650 of the second lithographic pattern 600. Thus, the offset of the first sub-pattern 601 is defined as $B^+$ while the offset of the second sub-pattern 701 is defined as $B^-$. In the illustrated embodiments, the magnitude B of the offsets is selected to be greater than the precision of metrology tools that will be used to measure the alignment of the patterns and less than the distances between the first sub-pattern 601 and the second sub-pattern 701.

FIG. 7 illustrates the second lithographic pattern 600 disposed with the first lithographic pattern 500. In the illustrated embodiment, the second lithographic pattern is properly aligned with the first lithographic pattern 500 however, in practice; the second lithographic pattern 600 is may be misaligned relative to the first lithographic pattern 500.

Figure 8:
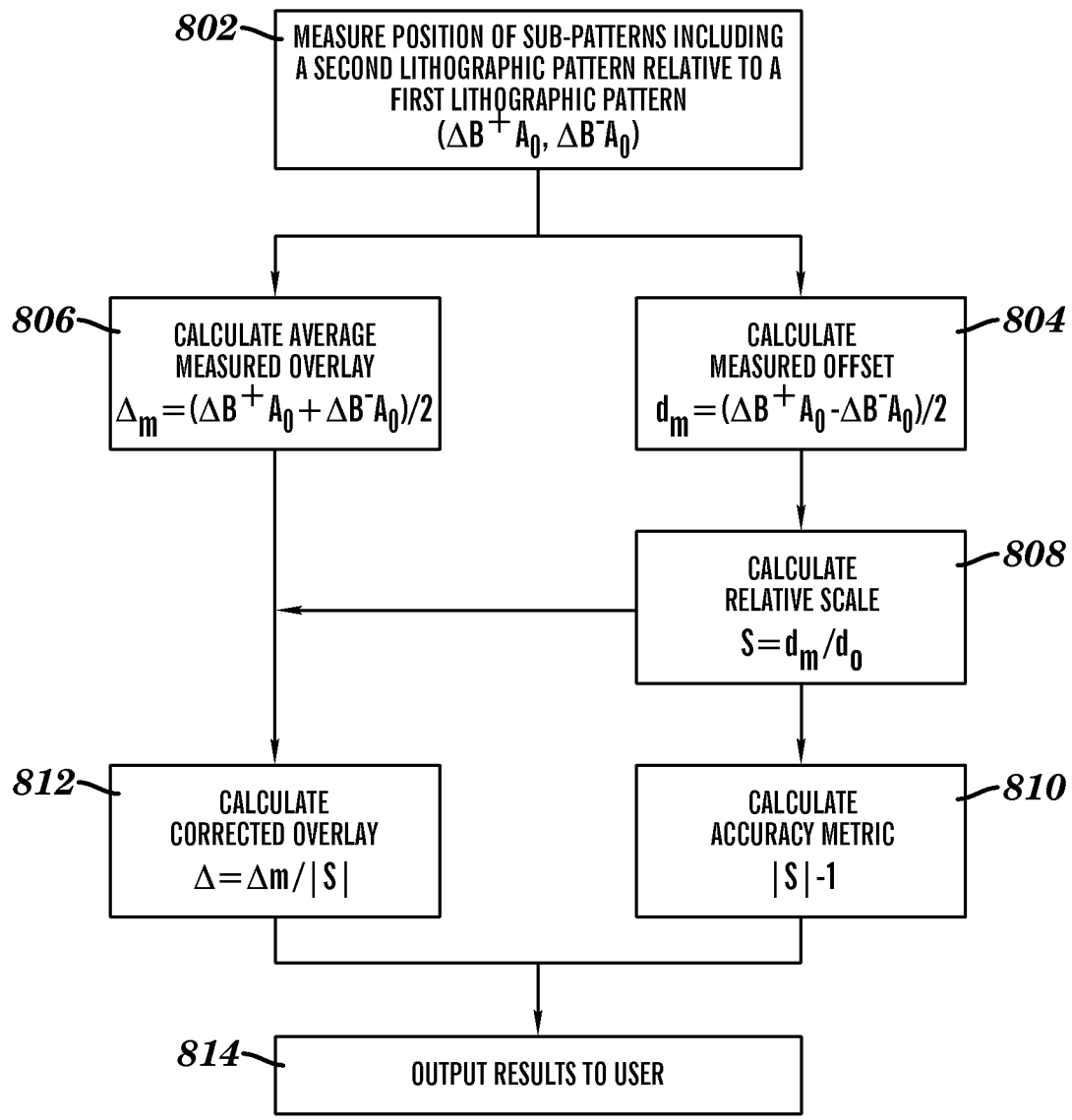
FIG. 8 illustrates a block diagram of an exemplary method for measuring and correcting the overlay of the patterns of FIG. 7.

Once the second lithographic pattern 600 is patterned with the first lithographic pattern 600, the alignment of the patterns may be measured. FIG. 8 illustrates a block diagram of an exemplary method for measuring the alignment of the patterns and correcting the overlay of the patterns that may be performed, by for example, the system 400 (of FIG. 4). The overlay correction may be used to, for example, correct for measurement errors due to imprecise metrology equipment used to measure the patterns. Referring to FIG. 8, in block 802, the positions of the sub-patterns 601 and 701 (of FIG. 6) are measured relative to the pattern 500. The positions may be measured by, for example, locating the center points 604 and 704 of the sub-patterns 601 and 701 respectively and measuring the positions of the center points 604 and 704 relative to the center point (A) 504 of the pattern 500. Where the distance in (x,y) coordinates from the point A is represented as ABA for the sub-pattern 601 and $\Delta B^- A$ for the sub-pattern 701. In block 804, an average measured overlay ($\Delta_m$) is calculated, where $\Delta_m = (\Delta B^+ A + \Delta B^- A)/2$. A measured offset ($d_m$) is calculated in block 804, where $d_m = (\Delta B^+ A - \Delta B^- A)/2$. In block 808, a relative scale (S) is calculated, where $S = d_m/d_o$, and $d_o$ is the magnitude B of the offset of the sub-patterns 601 and 701. Once the scale has been calculated, the corrected overlay (A) may be calculated in block 812 where $\Delta = \Delta_m / |S|$. In block 810, the magnitude of the scale measurement is calculated to define an accuracy metric where the accuracy metric is defined as 151-1. In block 814, the resultant calculations may be output to a user using, for example, the display device 404.

The magnitude of the calculated relative scale S may be used to monitor the accuracy of the measurements of the lithographic patterns 500 and 600 (of FIG. 7). The sign of the relative scale S may be used to monitor the relative orientation of the patterns 500 and 600. The scale-corrected alignment and overlay measurement may be used in conventional lithography feed-forward and feed-back control systems. The spatial variation of the scale-corrected alignment measurement over each wafer substrate may be modeled to determine post alignment adjustments of the lithography tool that minimize alignment variation over the wafer substrate. The adjustments may be fed-forward to the lithography tool prior to exposure of the wafer substrate. The spatial variation of the scale-corrected overlay measurements over a set of previously exposed wafers may be modeled to determine post alignment adjustments of the lithography tool that would have minimized overlay variation over that set of wafer substrates. The adjustments may be fed-back to the lithography tool prior to exposure of each similar set of wafer substrates. The lithography tool adjustments applied prior to the exposure of each wafer substrate are given by the sum of the adjustments based on the scale-corrected alignment and the scale-corrected overlay.

Figure 9:
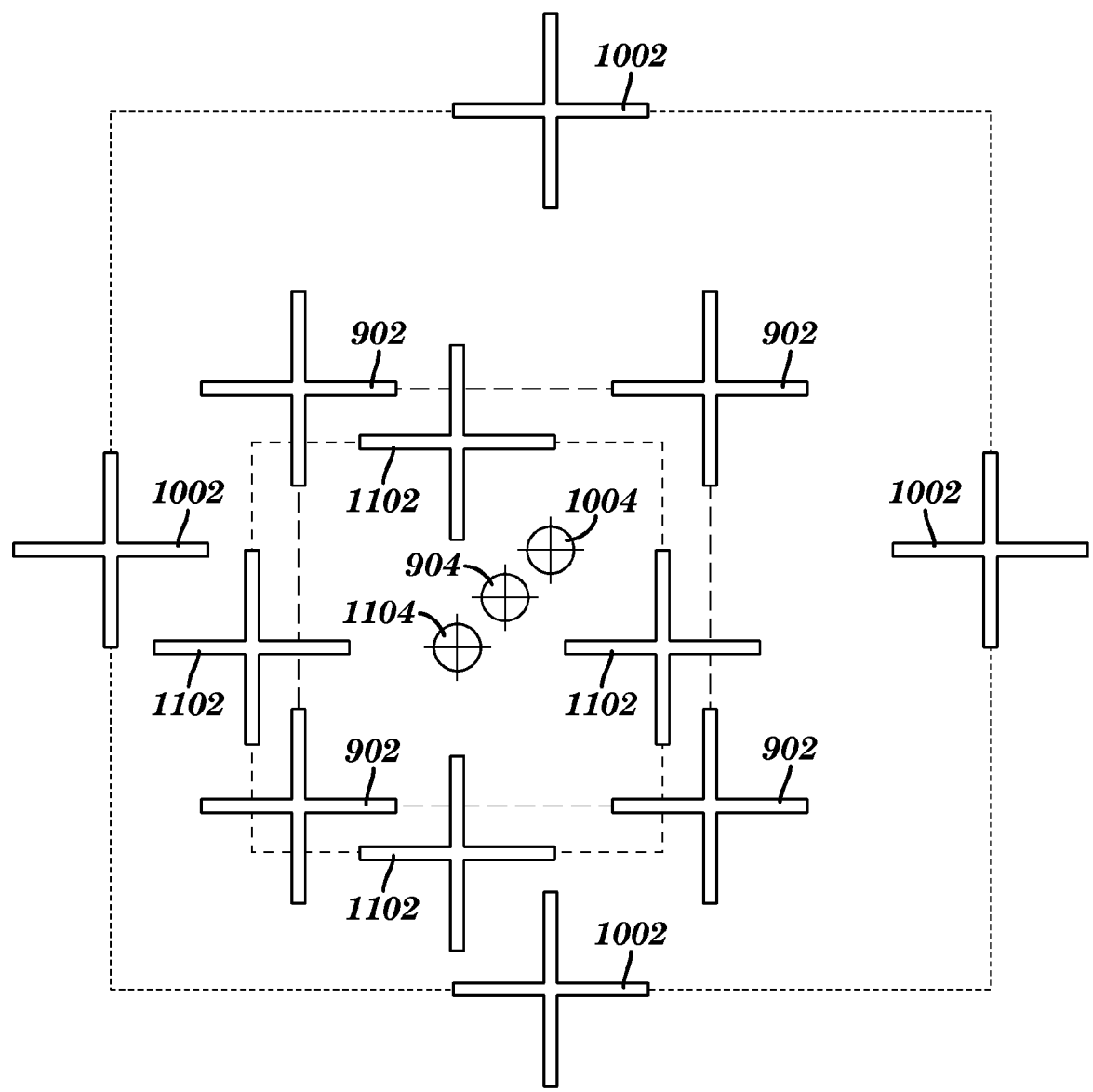
FIG. 9 illustrates an alternate exemplary embodiment of an arrangement of lithographic patterns.

The embodiments described above are non-limiting examples. Alternate embodiments may include patterns having any number of alignment marks and patterns having any number of sub-patterns. The alignment marks may be arranged or formed in any alternate pattern or having any alternate shape. FIG. 9 illustrates an alternate exemplary embodiment of an arrangement of lithographic patterns. In the illustrated embodiment a first pattern is defined by the alignment marks 902 having a geometric center point 904. A second pattern is defined by a first sub-pattern and a second sub-pattern. The first sub-pattern is defined by the alignment marks 1002 having a geometric center point 1004, while the second sub-pattern is defined by the alignment marks 1102 having a geometric center point 1104. The similar methods as those described above in FIG. 8 may be used to measure the arrangement of FIG. 9 or any other arrangement of lithographic patterns having at least one set of offset sub-patterns.

Figure 10:
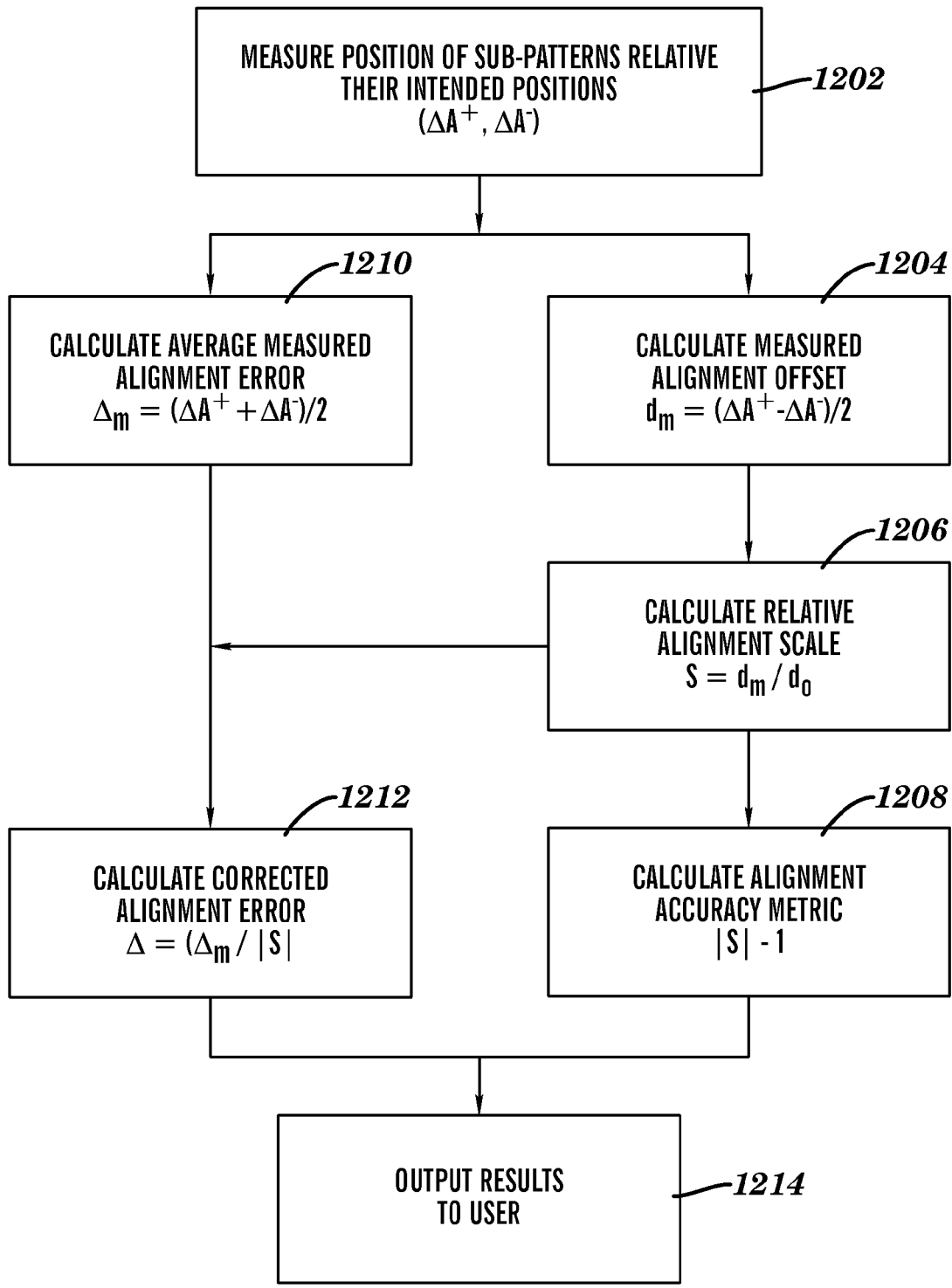
FIG. 10 illustrates a block diagram of an exemplary method for measuring the alignment of a pattern of lithographic marks.

FIG. 10 illustrates a block diagram of an exemplary method for measuring the alignment of a pattern of lithographic marks such as, for example, the pattern 600 of FIG. 6. Referring to FIG. 10, in block 1202, a position of the center points 604 and 702 ($\Delta A^+$ and $\Delta A^-$) are measured relative to the intended positions of the points (i.e., the position where the points should be if formed in perfect alignment and position as designed or intended by the designer). In block 1204, the measured alignment offset ($d_m$) is calculated where $d_m = (\Delta A^+ - A^-)/2$. The calculations may be performed by, for example, the processor 402 (of FIG. 4) The relative alignment scale (S) is calculated where $S = d_m/d_0$ in block 1206. In block 1208, an alignment accuracy metric ($|S|-1$) is calculated. An average measured alignment error ($A_m$) is measured in block 1210 where $\Delta_m = (\Delta A^+ + \Delta A^-)/2$. In block 1212, a corrected alignment error ($\Delta$) is calculated where $\Delta = \Delta_m/|S|$. The results may be output to a user on, for example, a display device 404 in block 1210.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An alignment feature disposed on a substrate, the alignment feature comprising:
    a first lithographic pattern having a central alignment axis with a first aggregate geometric center point extending between a pair of alignment marks, and at least one sub-pattern alignment axis that crosses the central alignment axis and is offset with respect to the first aggregate geometric center point defined by:
        a first sub-pattern comprising alignment marks having a first sub-pattern geometric center point arranged a distance ($d_0$) in a first direction from the first aggregate geometric center point; and
        a second sub-pattern comprising alignment marks having a second sub-pattern geometric center point arranged the distance $d_0$ in a reciprocal direction of the first direction from the first aggregate geometric center point.

2. The alignment feature of claim 1, wherein the alignment feature comprises a second lithographic pattern comprising alignment marks having a second aggregate geometric center point.

3. The alignment feature of claim 2, wherein the second lithographic pattern is a portion of a first lithographic layer disposed on the substrate, and the first lithographic pattern is a portion of a second lithographic layer disposed on the substrate.

4. The alignment feature of claim 1, wherein the first aggregate geometric center point is arranged substantially coincident with the second aggregate geometric center point.

5. The alignment feature of claim 1, wherein the distance $d_0$ is less than a distance between the alignment marks of the first sub-pattern and the alignment marks of the second sub-pattern.

6. A method for measuring alignment marks on a substrate, the method comprising:
    patterning a first lithographic pattern having a central alignment axis extending between a pair of alignment marks with a first aggregate geometric center point, and at least one sub-pattern alignment axis that crosses the central alignment axis and is offset with respect to the first aggregate geometric center point ($A_0$) defined by:
        a first sub-pattern comprising alignment marks having a first sub-pattern geometric center point ($A^+$) arranged a distance ($d_0$) in a first direction from the first aggregate geometric center point; and
        a second sub-pattern comprising alignment marks having a second sub-pattern geometric center point ($A^-$) arranged the distance $d_0$ in a reciprocal direction of the first direction from the first aggregate geometric center point;
    measuring a position error ($\Delta A^+$) of the first sub-pattern relative a position of the first sub-pattern geometric center and a position error ($\Delta A^-$) of the second sub-pattern relative to an intended position of the second sub-pattern geometric center; and
    calculating a measured alignment offset ($d_m$) of the sub-pattern geometric centers from the first aggregate geometric center, wherein $d_m=(\Delta A^+ - \Delta A^-)/2$.

7. The method of claim 6, wherein the method includes calculating a relative alignment scale (S), wherein $S=d_m/d_0$.

8. The method of claim 7, wherein the method further comprises calculating a corrected alignment error ($\Delta$), wherein $\Delta=\Delta_m/|S|$.

9. The method of claim 7, wherein the method further comprises calculating an alignment accuracy metric, wherein the alignment accuracy metric comprises $|S|-1$.

10. The method of claim 6, wherein the method further comprises calculating an average measured alignment error ($\Delta_m$) of the first lithographic pattern relative to a position of the first aggregate geometric center, wherein $\Delta_m=(\Delta A^+ + \Delta A^-)/2$.

11. A method for measuring alignment marks on a substrate, the method comprising:
    patterning a first lithographic pattern on the substrate, the first lithographic pattern comprising alignment marks having a central alignment axis extending between a pair of alignment marks with a first aggregate geometric center point ($A_0$);
    patterning a second lithographic pattern on the substrate, the second lithographic pattern having at least one sub-pattern alignment axis with a sub-pattern geometric center point, the at least one sub-pattern alignment axis crossing the central alignment axis and being offset with respect to the first aggregate geometric center point ($A_0$) such that the second aggregate geometric center point ($B_0$) is defined by:
        a first sub-pattern comprising alignment marks having a first sub-pattern geometric center point ($B^+$) arranged a distance ($d_0$) in a first direction from the second aggregate geometric center point; and
        a second sub-pattern comprising alignment marks having a second sub-pattern geometric center point ($B^-$)

arranged the distance $d_0$ in a second direction from the second aggregate geometric center point; and measuring a position ($\Delta B^+ A_0$) of the first sub-pattern relative to the point $A_0$, measuring a position ($\Delta B^- A_0$) of the second sub-pattern relative to the point $A_0$.

12. The method of claim 11, wherein the method further comprises calculating a measured overlay offset ($d_m$) of the sub-pattern geometric centers from the second aggregate geometric center, wherein $d_m = (\Delta B^+ A_0 - \Delta B^- A_0)/2$.

13. The method of claim 12, wherein the method further comprises calculating a relative overlay scale (S), wherein $S = d_m/d_0$.

14. The method of claim 13, wherein the method further comprises calculating a corrected overlay error ($\Delta$), wherein $\Delta = \Delta_m/|S|$ and $\Delta_m = (\Delta B^+ A_0 + \Delta B^- A_0)/2$.

15. The method of claim 13, wherein the method further comprises calculating an overlay accuracy metric, wherein the overlay accuracy metric comprises $|S|-1$.

16. The method of claim 11, wherein the method further comprises calculating an average measured overlay error ($\Delta_m$) of the second lithographic pattern relative to the first lithographic pattern, wherein $\Delta_m = (\Delta B^+ A_0 + \Delta B^- A_0)/2$.

* * * * *